United States Patent
Cao et al.

(10) Patent No.: US 10,903,333 B2
(45) Date of Patent: Jan. 26, 2021

(54) DOPED GATE DIELECTRIC MATERIALS

(71) Applicant: HRL Laboratories, LLC, Malibu, CA (US)

(72) Inventors: Yu Cao, Agoura Hills, CA (US); Rongming Chu, Agoura Hills, CA (US); Zijian Ray Li, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 10 days.

(21) Appl. No.: 15/663,584

(22) Filed: Jul. 28, 2017

(65) Prior Publication Data
US 2018/0097081 A1    Apr. 5, 2018

Related U.S. Application Data

(60) Provisional application No. 62/402,986, filed on Sep. 30, 2016.

(51) Int. Cl.
*H01L 29/51* (2006.01)
*H01L 29/20* (2006.01)
(Continued)

(52) U.S. Cl.
CPC ...... *H01L 29/518* (2013.01); *H01L 21/28264* (2013.01); *H01L 29/0649* (2013.01);
(Continued)

(58) Field of Classification Search
CPC .............. H01L 29/518; H01L 29/7813; H01L 29/4238; H01L 29/4236; H01L 29/517;
(Continued)

(56) References Cited

U.S. PATENT DOCUMENTS 6,152,075 A * 11/2000 Gardner ............. C23C 16/4409
118/504
8,853,709 B2   10/2014 Chu et al.
(Continued)

FOREIGN PATENT DOCUMENTS

JP    2017/305630 A    11/2007
KR   10-2016-0102613 A    8/2016

OTHER PUBLICATIONS

"An Optical Absorption Property of Highly Beryllium-Doped GaInAsP Grown by Chemical Beam Epitaxy", S. Nakamura et al., Jpn. J. Appl. Phys., 31, pp. 1255-1257, May 1992.
(Continued)

*Primary Examiner* — Steven H Loke
*Assistant Examiner* — Samuel Park
(74) *Attorney, Agent, or Firm* — Ladas & Parry

(57) ABSTRACT

A field effect transistor having at least a gate, source, and drain electrodes and a semiconductor channel for controlling transport of charge carriers between the source and drain electrodes, the gate being insulated from the channel by an dielectric, at least a portion of the dielectric disposed between the gate electrode and the semiconductor channel being doped or imbued with the an element which if doped or imbued into a semiconductor material would cause the semiconductor to be p-type. The p-type element used to dope or imbue the gate dielectric is preferably Mg.

35 Claims, 16 Drawing Sheets

(51) Int. Cl.
*H01L 29/778* (2006.01)
*H01L 29/78* (2006.01)
*H01L 29/417* (2006.01)
*H01L 29/43* (2006.01)
*H01L 29/06* (2006.01)
*H01L 21/28* (2006.01)
*H01L 29/423* (2006.01)

(52) U.S. Cl.
CPC .... *H01L 29/2003* (2013.01); *H01L 29/41766* (2013.01); *H01L 29/4236* (2013.01); *H01L 29/4238* (2013.01); *H01L 29/432* (2013.01); *H01L 29/513* (2013.01); *H01L 29/517* (2013.01); *H01L 29/7786* (2013.01); *H01L 29/7787* (2013.01); *H01L 29/7813* (2013.01); *H01L 29/7828* (2013.01); *H01L 29/42376* (2013.01); *H01L 29/7788* (2013.01)

(58) Field of Classification Search
CPC .......... H01L 21/28264; H01L 29/7787; H01L 29/513
See application file for complete search history.

(56) References Cited

U.S. PATENT DOCUMENTS

| | | | |
|---|---|---|---|
| 2010/0258841 A1* | 10/2010 | Lidow | H01L 29/1066 257/192 |
| 2011/0006345 A1* | 1/2011 | Ota | H01L 29/0657 257/192 |
| 2012/0012835 A1 | 1/2012 | Herman | |
| 2012/0319127 A1 | 12/2012 | Chowdhury | |
| 2013/0026495 A1 | 1/2013 | Chu | |
| 2013/0316507 A1* | 11/2013 | Saitoh | H01L 29/2003 438/285 |
| 2015/0137137 A1 | 5/2015 | Chowdhury | |
| 2016/0064520 A1 | 3/2016 | Pillarisetty | |
| 2016/0178570 A1* | 6/2016 | Fife | G01N 27/414 257/253 |
| 2016/0284804 A1* | 9/2016 | Shimizu | H01L 29/518 |
| 2016/0284830 A1 | 9/2016 | Shimizu | |

OTHER PUBLICATIONS

"Thermal Annealing Effects on P-Type Mg-Doped GaN Films", S. Nakamura et al., Jpn. J. Appl. Phys., 31, Pt.2, No. 2B, L139-142, Feb. 15, 1992.
"AlGaN/GaN Vertical Power Transistors", B. Lu and T. Palacios, MIT Microsystems Technology Laboratories Annual Research Report, De-29, pp. 84, 2009.
"High-performance Enhancement-Mode AlGaN/GaN HEMTs Using Fluoride-Based Plasma Treatment", Cai et al., IEEE Electron Device Letters, vol. 26, No. 7, pp. 435-437, Jul. 2005.
"1200-V Normally Off GaN-on-Si Field-Effect Transistors With Low Dynamic ON -Resistance", IEEE Electron Device Letters, vol. 32, No. 5, pp. 632-634, May 2011.
"P-GaN/AlGaN/GaN Enhancement-Mode HEMTs", C.S. Suh et al., Device Research Conference, 2006 64th, Jun. 26-28, 2006, p. 163,available at: ieeexplore.ieee.org/document/4097584/.
www.semiconductor-today.com/news_items/2014/FEB/TOYODAGOSEI_200214.shtml.
PCT International Search Report and Written Opinion from PCT/US2017/044532 dated Nov. 9, 2017.
Li, et al., "600 V/1.7 Ω Normally-Off GaN Vertical Trench Metal-Oxide-Semiconductor Field-Effect Transistor," IEEE Electron Device Letters, vol. 37, No. 11, Nov. 2016, pp. 1466 to 1469.
Semiconductor Today, "Vertical GaN transistor with 1.6kV blocking voltage," www.semiconductor-today.com/news_items/2014/FEB/TOYODAGOSEI_200214.shtml, printed Jul. 26, 2017.
PCT International Preliminary Report on Patentability (Chapter II) from PCT/US2017/044532 dated Nov. 5, 2018.
Extended Search Report from European Patent Application No. 17856962.0 dated Apr. 6, 2020.

* cited by examiner

E-mode III-V HEMT with p-type dopant doped Gate Dielectrics

D-mode group III-V HEMT with p-type dopant doped Gate Dielectric

E-mode III-V HEMT with p-type dopant doped Gate Dielectric

Rounded corners formed by etching

DOPED GATE DIELECTRIC MATERIALS

CROSS REFERENCE TO RELATED APPLICATIONS

This application claims the benefit of U.S. Provisional Patent Application No. 62/402,986 filed 30 Sep. 2016, the disclosure of which is hereby incorporated herein by reference.

STATEMENT REGARDING FEDERALLY SPONSORED RESEARCH OR DEVELOPMENT

This invention was made with Government support under Contract No. DE-AR000450 awarded by the Department of Energy. The Government has certain rights in the invention.

TECHNICAL FIELD

This disclosure relates, in general, to the doping of gate dielectric materials with an impurity which, if it were used with a semiconductor, would be considered to be a p-type dopant. The use of doped gate dielectric materials is explained herein with respect to III-Nitride field effect transistors (FETs). Device structures and methods for fabricating metal insulator semiconductor field effect transistors are included in this explanation.

BACKGROUND

Due to the excellent material properties of GaN, transistors made of GaN, including AlGaN, are suitable for high voltage, high temperature and fast operation. One key application of GaN-based transistors is to make switching devices that can manage the electric power flow. For power switch applications, it is highly desirable to use transistors working in a normally-off (or enhancement) mode with a positive threshold voltage. To have the devices safely controlled, circuit designers desire that the turn on threshold voltage (applied to the gate of the device) be at 3 volts or higher. It is also desired by device engineers to have the ability to tune the threshold voltage of a given device without having to also change the epitaxial structure of that device.

AlGaN and GaN transistors are often implemented as High Electron Mobility Transistors (HEMTs). Most AlGaN and GaN devices are horizontal devices, but it has been found that vertical transistors are preferred due to their lower parasitic inductance, higher blocking voltage, and smaller size. See, for example, "AlGaN/GaN Vertical Power Transistors" by B. Lu and T. Palacios, *MIT Microsystems Technology Laboratories Annual Research Report* 2009, Dec. 29, the disclosure of which is hereby incorporated herein by reference. The B. Lu and T. Palacios prior art device can be improved in accordance with the present disclosure. One only needs to replace the AlGaN layer shown in FIG. 2 of the B. Lu and T. Palacios paper (under the gate) with a Mg-doped dielectric layer which is disclosed herein. The device disclosed by B. Lu and T. Palacios would then have the capability of being able to tune its threshold voltage. The process flow could be: 1. pattern the wafer and etch the AlGaN beneath the gate away to expose the GaN channel; 2. Grow/deposit Mg-doped gate dielectric layer on the exposed GaN channel; 3. Deposit gate metal on the gate dielectrics.

The device shown in FIG. 2 of the B. Lu and T. Palacios paper can also be improved, by doping the dielectric layer that they utilize with Mg. The difference between replacing their selected dielectric with Mg-doped dielectric material which is disclosed herein and using their selected dielectric (but doped with Mg), will manifest itself by the amount that the gate threshold voltage is controlled by the Mg doping. Doping with Mg will have a greater effect if the AlGaN layer shown in FIG. 2 of the B. Lu and T. Palacios paper (under the gate) is replaced with the Mg-doped dielectric layer disclosed herein.

GaN and AlGaN vertical transistor technology is important for energy efficient power management systems, especially at high power. Such power management systems are important for electric cars, electrically propelled aircraft, and virtually anything that is powered by electricity. For power switching transistors, a positive threshold voltage is desired. The gate structure proposed in this technology is an important enabler for the GaN vertical transistor technology to be adopted in power management systems.

For power switch applications, it is highly desirable to use transistors working in normally-off mode (with a zero gate voltage applied thereto) which means that the transistors are so-called enhancement mode transistors. Depletion mode transistors, on the other hand, are normally on with a zero gate voltage applied thereto. In order to enable normally-off operation, it is preferable to have a gate dielectric which can allow a positive bias on the gate without having a trapping or leakage problem. See U.S. Pat. No. 8,853,709 to Rongming Chu, et al., which is assigned to the assignee of the present application and which teaches stacked AlN/SiN dielectric layers for GaN transistors. This patent, which is hereby incorporated herein by reference, provides a good solution for robust gate dielectrics and little hysteresis effect. But it does not discuss intentional doping in its stacked dielectric layers.

There are generally three ways known in the prior art to make an enhancement mode device from what would otherwise be a depletion mode device:

1. Using Fluorine plasma treatment for the gate area before the gate metal is deposited (see "High-performance enhancement-mode AlGaN/GaN HEMTs using fluorine-based plasma treatment", *IEEE Electron Device Lett.*, vol. 26, no. 7, pp. 435-437, July 2005.);

2. Etching the barrier completely in the gate area, deposit dielectrics followed by gate metal (see "1200-V Normally Off GaN-on-Si Field-Effect Transistors With Low Dynamic on-Resistance", *IEEE Electron Device Letters*, vol 32, p 632, 2011);

3. Selectively grow/form another p-type layer on top of the AlGaN in the gate area before the gate metal is deposited (see C. S. Suli et al., "p-GaN/AlGaN/GaN Enhancement-Mode HEMTs", *Device Research Conference*, 2006 64th, 26-28 Jun. 2006, p. 163, available at ieeexplore.ieee.org/document/4097584/).

Enhancement mode HEMTs made by any of these three prior art methods have a threshold voltage (Vt) no higher than 2V. Most of them have a Vt of 1.0-1.5 V. The presently disclosed technology provides another way to make an enhancement mode device from what would otherwise be a depletion mode device and importantly provides a convenient way to have Vt exceed this limit and be tunable up to 12V, without adding additional appreciable epitaxial cost of manufacture or dictating a brand new device configuration.

While this invention may be used to make an enhancement mode device from what would otherwise be a depletion mode device, without needing to change the epitaxial structure of the device, this invention can also be used to adjust the device characteristics, again without necessarily having to change the epitaxial structure of the device. So the present invention can be used to change the device characteristics of a depletion mode device and depending on the amount of change which is desired, the resulting device may still be depletion mode or it may be enhancement mode. The present invention can also be used to change the device characteristics of as enhancement mode device, again without necessarily having to change the epitaxial structure of the device. And, of course, this invention can also be used to adjust the characteristics of a device as it is being designed ab initio.

The prior art includes S. Nakamura et al., *Jpn. J. Appl. Phys.*, 31 (1992) L139-L142 and S. Nakamura et al., *Jpn. J. Appl. Phys.*, 31 (1992) 1258-1266. These papers focus on how to make p-type GaN by doping it with Mg and performing a post-growth annealing under a $N_2$ gas ambient.

A prior art GaN vertical transistor often has a p-GaN base layer (also called current blocking layer) to form a normally-off channel. See www.semiconductor-today.com/news_items/2014/FEB/TOYODA GOSEI_200214.shtml. The present invention can be utilized with both lateral GaN HEMTs and vertical GaN HEMTs.

The process of growing of an AlN/SiN dielectric stack in the prior art usually introduces H into the device structure. $H_2$ may passivate the Mg and reduce the P-type behaviors of the Mg-doped GaN layer. Instead we grow AlN and SiN preferably using Metal Organic Chemical Vapor Deposition (MOCVD) and using ammonia as the nitrogen source for the AlN and SiN.

In this invention disclosure, we suggest an additional step of thermal annealing after the gate dielectric growth. Such thermal annealing can partially resolve the aforementioned H-passivation problem. Such thermal annealing should be performed in an ambient not containing H.

We further show that adding Mg doping during the AlN growth can further shift the threshold voltage toward the positive.

BRIEF DESCRIPTION OF THE INVENTION

In one aspect the present invention provides a field effect transistor having at least a gate electrode, a source electrode, and a drain electrode and a semiconductor channel for controlling transport of charge carriers between the source and drain electrodes, the gate electrode being insulated from the semiconductor channel by a Group III nitride gate dielectric layer, at least a portion of the Group III-nitride gate dielectric layer disposed between the gate electrode and the semiconductor channel being doped or imbued with a p-type impurity. The p-type impurity is preferably Mg and the concentration of Magnesium in the dielectric is preferably on the order of $2 \times 10^{18}$ $cm^3$.

The semiconductor channel may occur in a p-type base layer. An additional semiconductor layer may be disposed on the semiconductor channel and wherein the Group III-nitride gate dielectric and the gate electrode may be disposed in a trench at least partially penetrating the additional semiconductor layer.

In another aspect the present invention provides a field effect transistor having at least a n-type Group III-nitride material drift layer, a p-type Group III-nitride material base layer disposed over the n-type Group III-nitride material drift layer, and a gate dielectric layer preferably disposed in contact or adjacent the n-type Group III-nitride material drift layer or with a channel layer in contact with n-type Group III-nitride material drift layer, at least a portion of the gate dielectric layer being doped or imbued with an impurity which if doped into a semiconductor material would cause the semiconductor to be p-type. The p-type impurity is preferably Mg.

In still yet another aspect the present invention provides a vertical field effect transistor having at least gate electrode, a source electrode, and a drain electrode and a semiconductor channel for controlling transport of charge carriers between the source and drain electrodes, the gate electrode being insulated from the semiconductor channel by a Group III-nitride gate dielectric layer, at least a portion of the Group III-nitride gate dielectric layer disposed between the gate electrode and the semiconductor channel being doped with a p-type dopant, the source and gate electrodes being disposed at or near a top of the transistor device and the drain electrode being disposed at or near a bottom of the transistor device, the semiconductor channel being located between the gate and drain electrodes and insulated from said gate electrode by said Group III-nitride gate dielectric layer.

In yet another aspect the present invention provides a method of increasing a threshold voltage of an enhancement mode FET device having a gate dielectric layer, the method comprising doping or imbuing the gate dielectric layer with a material which if doped into a semiconductor material would cause the semiconductor to be p-type. The p-type material is preferably Mg. Preferably after the gate dielectric layer is grown by MOCVD, for example, the Mg is re-activated by a post growth anneal.

In yet another aspect the present invention applies Mg doping in gate dielectric layers, such as AlN and SiN, preferably grown by MOCVD. By adjusting the Mg doping concentration combined with a post-growth annealing technique, the threshold voltage can be selectively tuned.

BRIEF DESCRIPTION OF THE DRAWINGS

FIG. 4-10 depicts a cross section image of a portion of the resulting device taken by Transmission Electron Microscopy (TEM).

FIG. 5-1 is a top view schematic of an embodiment of the present invention which has a hexagonal layout design, FIG. 5-1 showing one device at its center and portions of six other such devices surrounding the central device, all of which are preferably being formed at the same time.

FIG. 5-2 is a microscopic photograph of a fabricated device (the vertical transistors of FIGS. 5-1 in an array of thirty-five devices wide by eighteen devices tall).

FIG. 5(a) is a graph of the output IV characteristics of the fabricated GaN vertical trench MOSFET of FIG. 5-1 while

FIG. 7 shows two vertical FETs, each similar to the vertical FET embodiment of FIG. 2, but with a passivation layer, a gate interconnect layer and an implanted isolation region also shown.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112(f). In particular, the use of "step of" or "act of" in the claims herein is not intended to invoke the provisions of 35 U.S.C. 112(f).

The technology disclosed herein is applicable to both vertically and laterally arranged FET type transistors. Some may find this technology to be particularly useful for vertical FETs for the reasons previously stated about the advantages of vertical HMETs and thus we will be presenting a rather detailed discussion of the use of this technology in the context of a vertical transistor later in this disclosure. However, to begin with we will discuss this technology in terms of a prior art lateral GaN FET shown in FIG. 1a which we compare with an improved lateral GaN FET, having a Mg doped dielectric, an embodiment of which is shown in FIG. 1b.

Figure 1A:
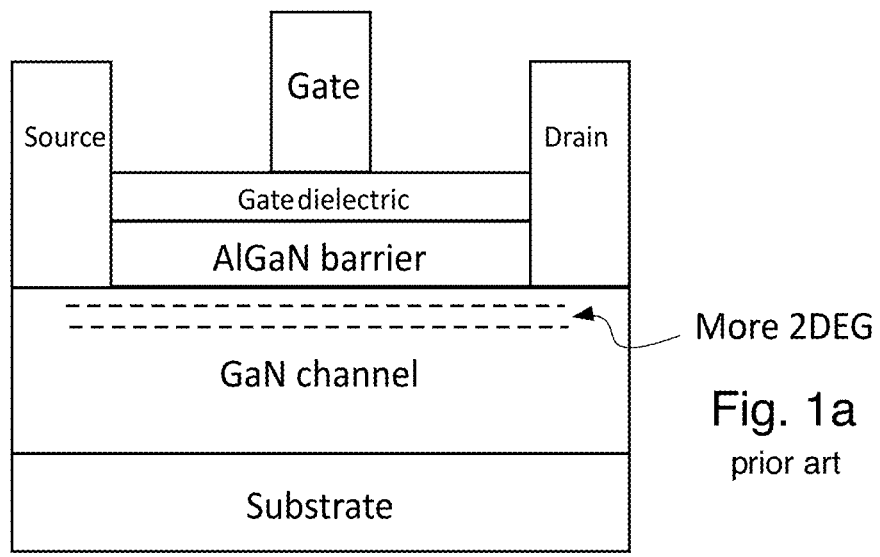
FIG. 1a depicts a prior art depletion mode vertical enhancement transistor.

FIG. 1a shows an embodiment of a conventional depletion mode lateral FET transistor. The particular prior art transistor being depicted has a GaN channel layer with an AlGaN barrier layer. The GaN channel layer may be disposed on a substrate with source and drain electrode disposed laterally and spaced from the gate electrode. This prior art device has a 2 Degree Electron Gas (2DEG) in the GaN channel layer, the extent of which will dictate its gate threshold voltage when charge carriers start (or stop) flowing. Typically, this prior art device will have a greater negative gate threshold voltage compared to the embodiment of FIG. 1b which has a Mg doped dielectric layer between the AlGaN barrier layer and the gate electrode but which is otherwise quite similar to the prior art device of FIG. 1a.

Figure 1B:
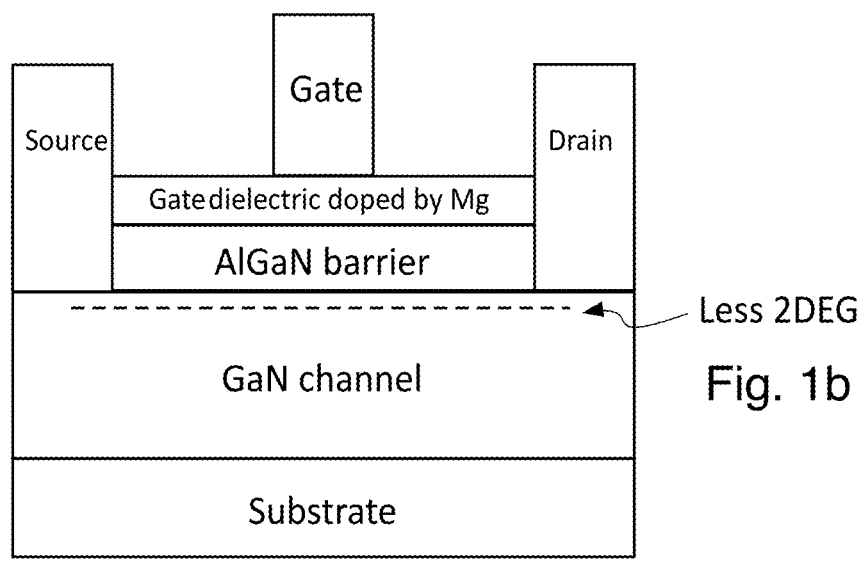
FIG. 1b depicts an embodiment of a lateral depletion mode transistor with AlN:Mg as a gate dielectric material.

The transistor of FIG. 1b differs from the prior art device of FIG. 1a in that its gate dielectric is doped with Mg. This doping of the gate dielectric has the effect of reducing the electron gas density (2DEG density) in the channel. And that, in turn, has the effect of making the gate threshold voltage of the device more positive (higher) compared to the otherwise very similar prior art device of FIG. 1a.

Importantly, controlling the level of Mg doping in the gate dielectric, will control by how much the gate threshold voltage changes. So the device of FIG. 1b is basically gate threshold voltage controllable without a need to change the structure of the device.

Figure 1C:
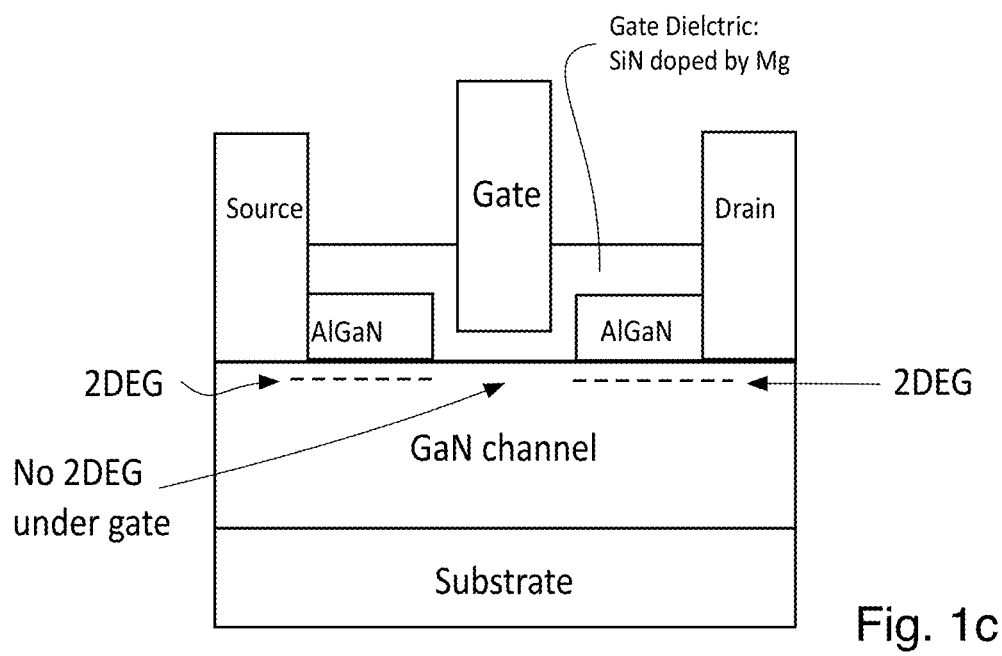
FIG. 1c depicts an embodiment of a lateral enhancement mode transistor with AlN:Mg as a gate dielectric material.

Of course, other device structures may be used, such as those depicted by FIG. 1c—, but the basic principle remains that controlling the dopant level in the gate dielectric has an effect of also affecting the gate threshold voltage of the device.

It also bears mentioning at this point that other semiconductor materials may be used with a different gate dielectric dopant than the Mg discussed so far. This will also be discussed subsequently herein, although Mg, at present, is the preferred gate dielectric dopant to be used with GaN type devices.

FIG. 1c depicts an embodiment of a GaN lateral enhancement mode FET (and preferably a HEMT FET) transistor which has no AlGaN barrier layer immediately under the gate, but does have a SiN Mg doped dielectric layer between the gate and the GaN channel. SiN is one possible gate dielectric material, but not the only gate dielectric material, which is doped with Mg (or another p-type dopant) to modify or adjust the gate threshold voltage of the device. See also the embodiment of FIG. 1e.

Figure 1D:
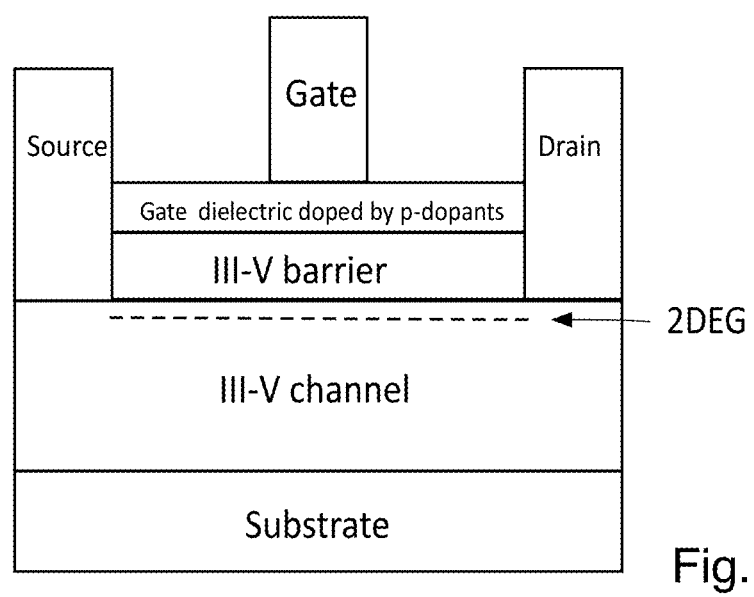
FIG. 1d depicts an embodiment of a lateral depletion mode group III-V transistor with a p-type doped dielectric material as a gate dielectric layer.

FIG. 1d depicts an embodiment of group III-V lateral depletion mode FET (and preferably a HEMT FET) transistor which has a group III-V barrier layer under the gate and a p-type doped dielectric layer between the gate the barrier layer. The gate dielectric material is doped with one or more p-type dopants. Mg is a p-type dopant which may be used to dope the gate dielectric material to modify or adjust the gate threshold voltage of the device.

Figure 1E:
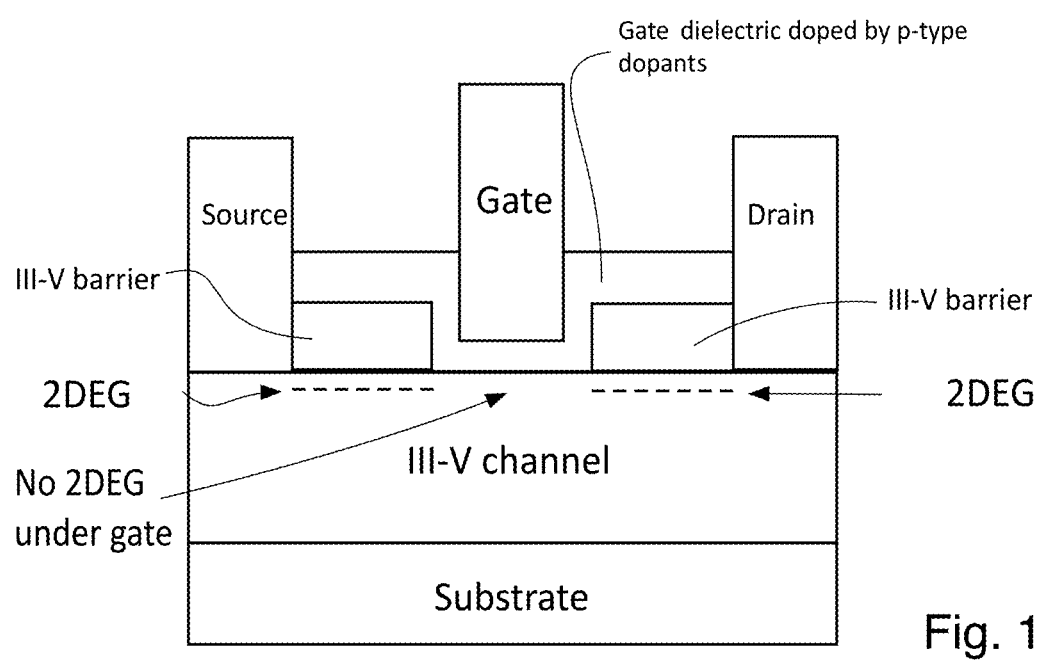
FIG. 1e depicts an embodiment of a lateral enhancement mode group III-V transistor with a p-type doped dielectric material as a gate dielectric layer.

FIG. 1e depicts an embodiment of a device similar to that of FIG. 1c in that it also shows an embodiment of a lateral enhancement mode FET (and preferably a HEMT FET) transistor, but in this embodiment the materials for the various layers are shown more generically, so the channel and barrier materials are simply depicted as group III-V material. The gate dielectric material is simply a gate dielectric material doped with one or more p-type dopants.

As will be discussed below, an anneal at a temperature of above 750° C. can have further advantageous effects in terms of activating the Mg dopant. Preferably the anneal is at 800° C. (or higher) for 10 mins (or longer).

Figure 2:
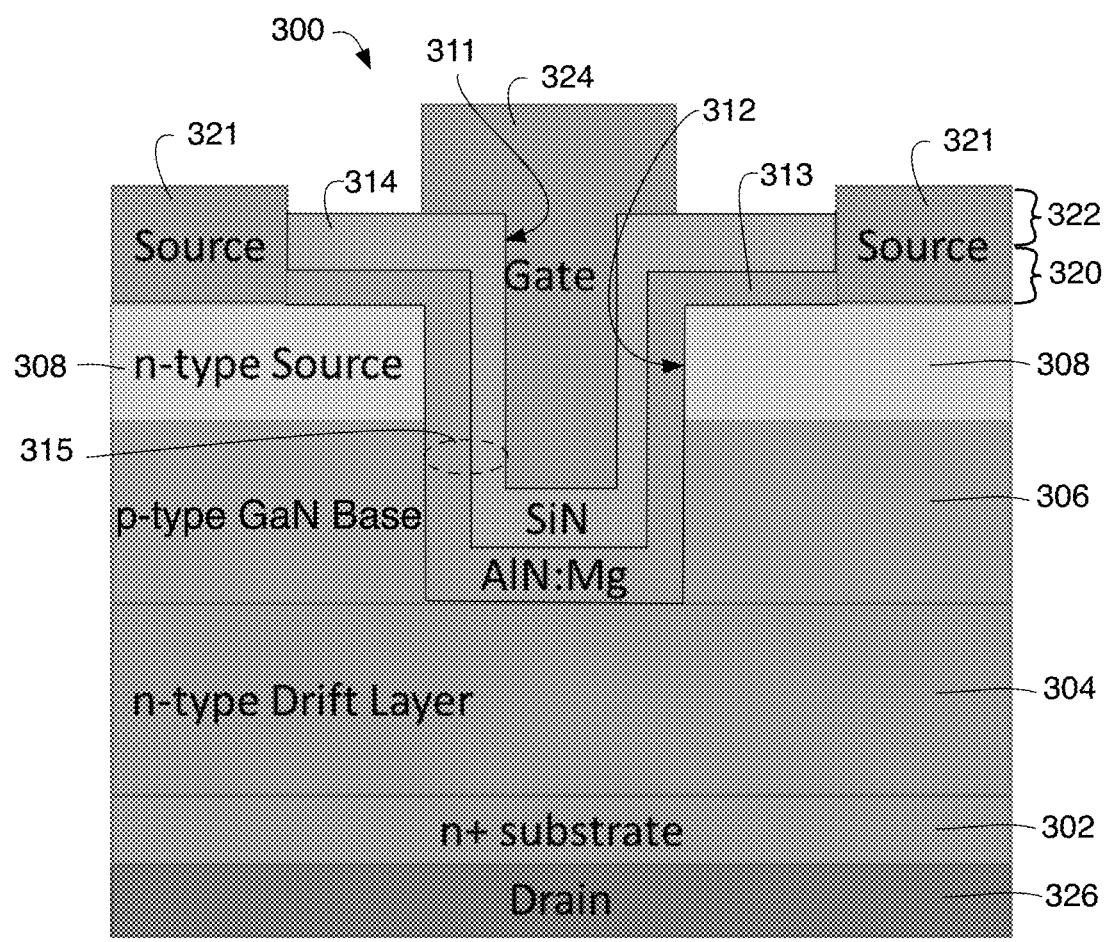
FIG. 2 depicts an embodiment of a vertical enhancement mode transistor with AlN:Mg as a gate dielectric material.

As is mentioned above, a vertical arrangement of a FET with the drain disposed at the bottom of the device as opposed to disposed laterally to one side of the gate is popular for a number of reasons, including the fact that a number of vertical 1-ET devices can be formed at the same time and easily connected in parallel with one another. The individual vertical FET devices tend to be small with a small pitch (center-to-center distance between neighboring devices). FIG. 2 depicts one embodiment of a single vertical FET device, it being understood that typically many of these devices would likely be formed at the same time and would appear, from a top down view thereof, to be a two dimensional array of such devices (see FIG. 5-1). FIG. 2 shows only one such device for ease of illustration.

The embodiment depicted by FIG. 2 is a vertical group III-V nitride transistor 300 (a GaN vertical MOSFET in this particular embodiment) having a layer 313 of a dielectric (AlN in this embodiment) doped by Mg and preferably also having a layer of another dielectric (SiN in this embodiment) 314, the layers 313 and 314 forming a dielectric stack which function together as a gate dielectric 315 for gate 324. In making the vertical group-III nitride transistor 300 a trench 312 is preferably etched through a top n+ type group III nitride source layer (n+ GaN in this embodiment) 308 and at least partially through a p-type group III nitride base layer 306 (p-type GaN in this embodiment). In FIG. 2 this etching is depicted as going completely through the base layer 306, but this etching could stop somewhere in the base layer 306. But for device performance, we prefer that the base layer 306 be etched completely through and for this etching to stop at or in a n-type group III nitride drift layer 304 (n-type GaN in this embodiment) disposed below the base layer 306. The dielectric layer 313 and the SiN layer 314 are preferably formed as a stack on both the sidewalls and the bottom of the trench 312, leaving an opening or trench 311 for gate 324 between the dielectric 315 covered side walls. The dielectric layer 314 is doped by a p-type dopant such as Mg. Gate metal 324 is formed in the trench 312 after trench 312 has been covered by the stack dielectric 315 formed by layers 313 and 314

Figure 2A:
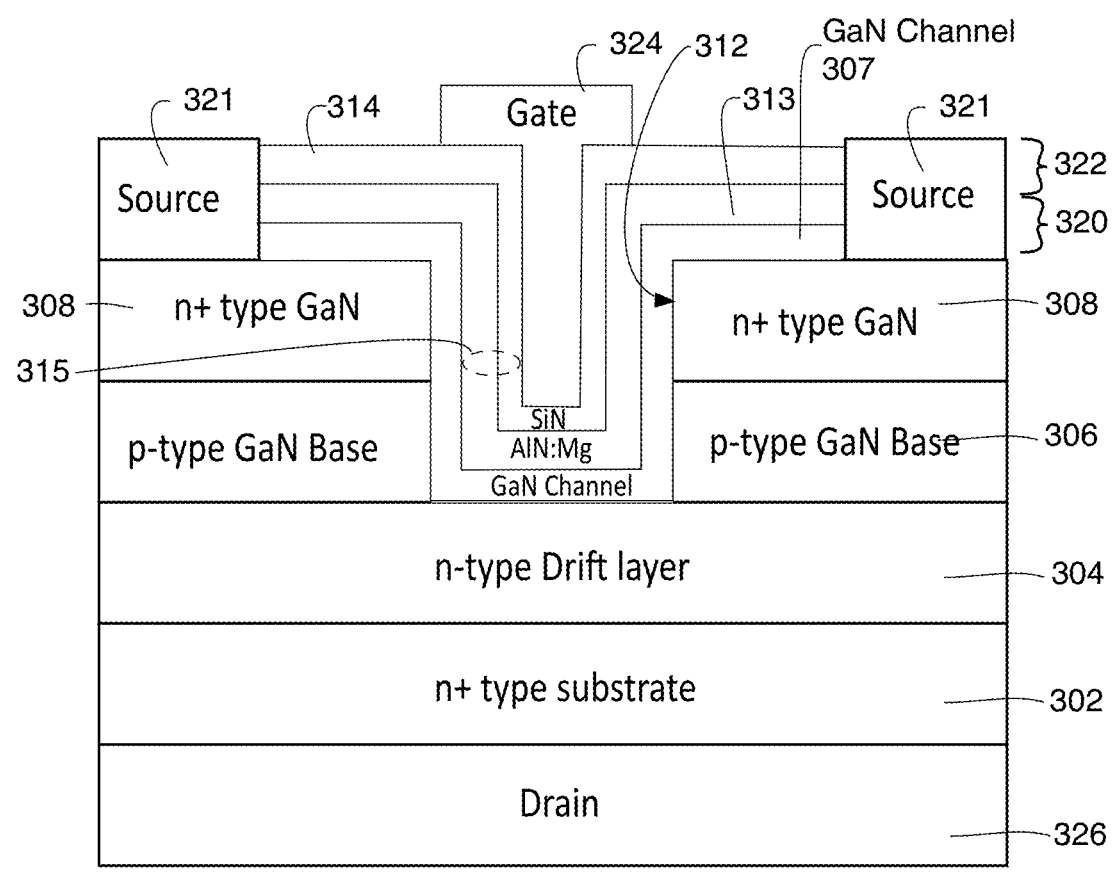
FIG. 2a shows a modification of the embodiment of FIG. 2 wherein a GaN channel layer is formed in a trench before a gate dielectric stack is deposited.

FIG. 2a shows a modification of the embodiment of FIG. 2 wherein a GaN channel layer 307 is formed in trench 312 before the gate dielectric stack 315 of dielectrics 313 and 314 are deposited. The GaN channel layer 307 may be formed by a growth (or regrowth) process such as Metal Organic Chemical Vapor Deposition (MOCVD). The regrowth of the GaN channel material 307 may occur on the side walls of the gate trench 312 before forming the gate dielectric 315 to improve the drain current characteristics.

The word "type" generally refers to the conductivity type of a semiconductor which results from the particular dopant or dopants used to affect its conductivity or it refers to the particular dopant or dopants normally used to achieve a particular conductivity type in a semiconductor. The word "group" above refers to a particular group of the periodic table (as used in the semiconductor industry in the United States) into which an element falls. Group III materials include Boron, Aluminum, Gallium, and Indium.

Source contacts 321 are preferably formed on the n+ GaN source layer 308 and spaced from the gate metal 324 by the stack dielectric 315 formed by layers 313 and 314. The source contacts 321 may be formed of a first layer of a metal 320 (see also FIG. 3-6) such as an alloy of Ni/Au in contact with the n+ GaN source layer 308 which are covered by a second layer of another metal 322 (see also FIG. 3-7) such a stack of Ti/Au metals. A drain contact 326 is formed on the bottom of the transistor 300 after the formation of source contacts 321 unless it is formed earlier in the fabrication process.

Figure 3:
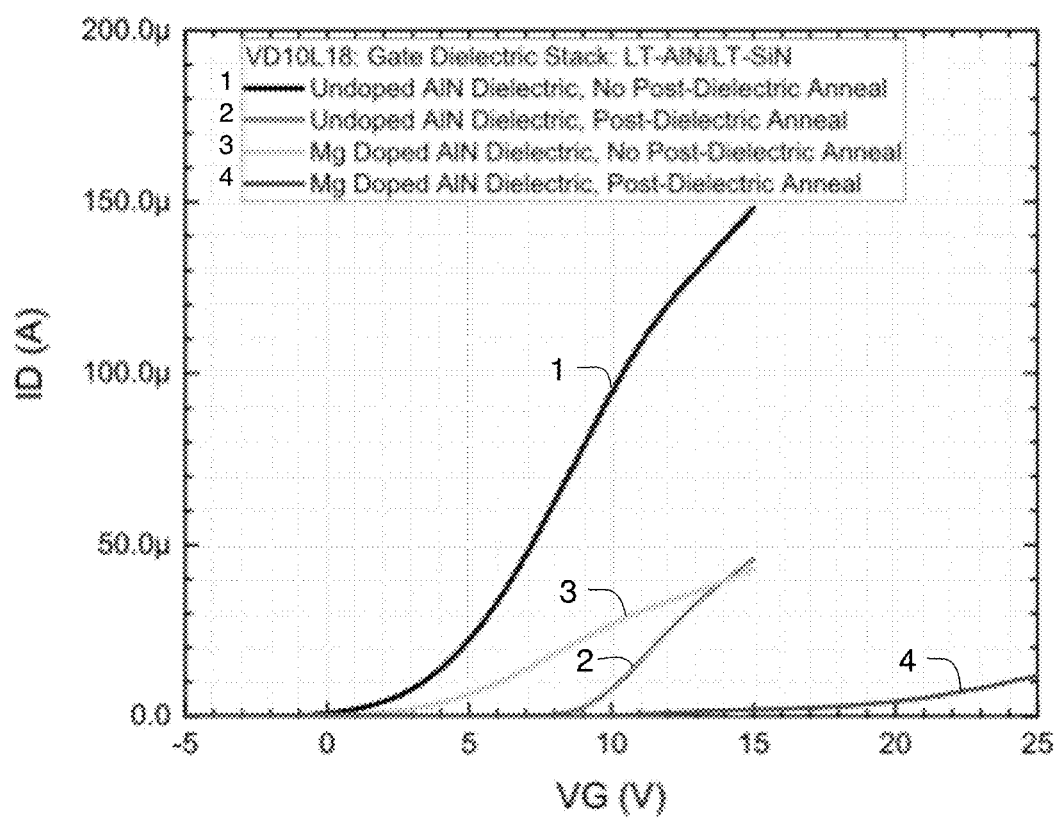
FIG. 3 is graph of drain current vs. gate voltage (transfer curve) for four devices having a doped or undoped AlN dielectric and with and without an annealing step after the dielectric is deposited.

FIG. 3 is a graph showing that using undoped AlN dielectric layer without a post-growth annealing (see curve 1), the threshold voltage is about 1 v. After performing a post-growth anneal at 850° C. for 15 minutes, the threshold voltage increases to about 8 v (see curve 2). Using an Mg-doped AlN dielectric layer, the threshold voltage is about 2 v without this anneal (see curve 3) and increases to about 12 v after this anneal (see curve 4). This experimental data shows that the Mg doping of the AlN layer 314 can change the threshold voltage of the vertical GaN transistor 300 as can post-growth annealing. It is believed that other dielectric materials than AlN (such as $SiO_2$, SiN $HfO_2$, etc) may be used and doped as described herein.

FIGS. 4-1 through 4-9 show major processing steps for fabricating one embodiment of a vertical transistor 300 preferably using the materials mentioned above (they are also mentioned parenthetically above in most cases) and in accordance with the present invention. These figures depict a cross section view of a single pitch of one vertical transistor 300 (with one etched gate trench), but the transistors 300 are preferably formed in a two dimensional array of such transistors 300, all being connected in parallel to form a larger device (which can achieve high current operational capabilities) and all preferably being formed during the sequence of process steps explained below with reference to FIGS. 4-1 through 4-9. The transistor or transistor unit 300 of these figures preferably has a GaN covered vertical trench 312 such as that generally depicted in FIGS. 2 and 2a. Multiple transistor units 300 are preferably formed as the same time and preferably all connected up in parallel to form the aforementioned larger device (shown in FIG. 5-1).

The process preferably starts (see FIG. 4-1) with Metal Organic Chemical Vapor Deposition (MOCVD) growth of the n− GaN drift layer 304 and the p-GaN base layer 306 on a bulk GaN substrate 302. The drift layer 304 is preferably about 8 μm thick. It preferably has a Si doping concentration of $1\sim2\times10^{16}$ $cm^{-3}$, as determined by Secondary Ion Mass Spectrometry (SIMS). Capacitance-voltage (CV) measurements yielded a net electron concentration of $\sim5\times10^{15}$ $cm^{-3}$. Any discrepancy between Si concentration and net electron concentration can be attributed to compensation centers such as C impurities. The base layer 306 is preferably about 800 nm thick. It preferably has a Mg concentration of $\sim2\times10^{18}$ $cm^{-3}$, as may be determined, for example, by SIMS.

Figures 1, 4:
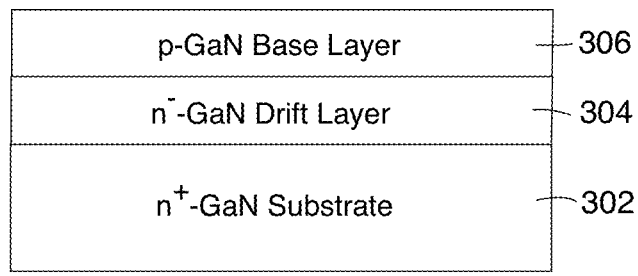
FIGS. 4-1 through 4-9 depict the major steps in an embodiment of a process flow for making an embodiment of the vertical transistor of FIG. 2.
Figures 2, 4:
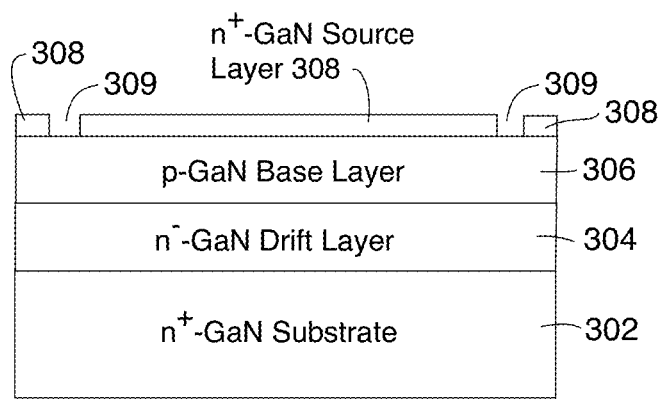
Figures 3, 4:
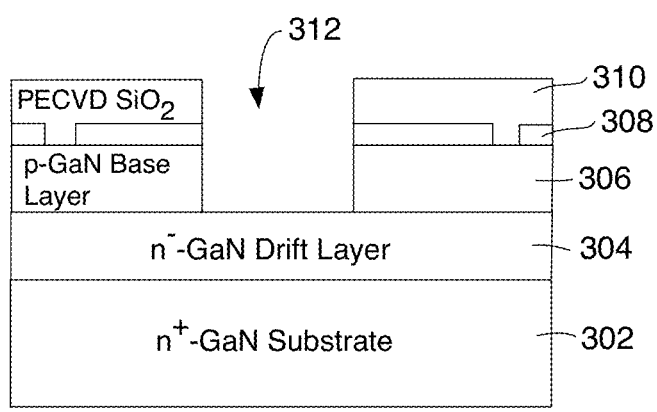
Figure 4:
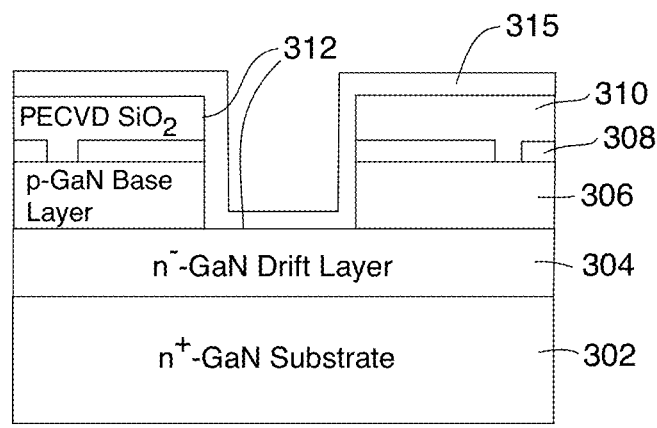
Figures 4, 5:
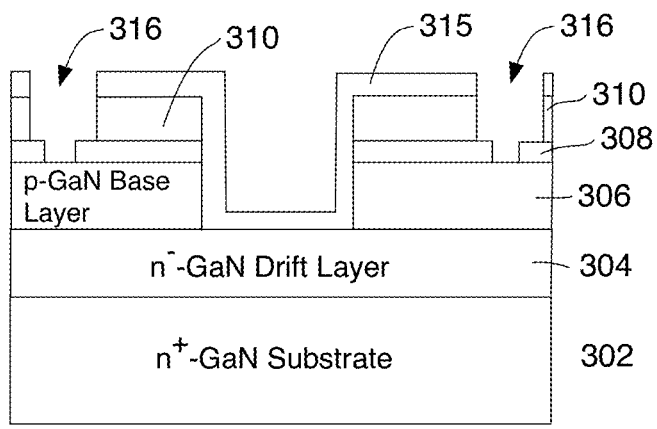
Figures 4, 5, 6:
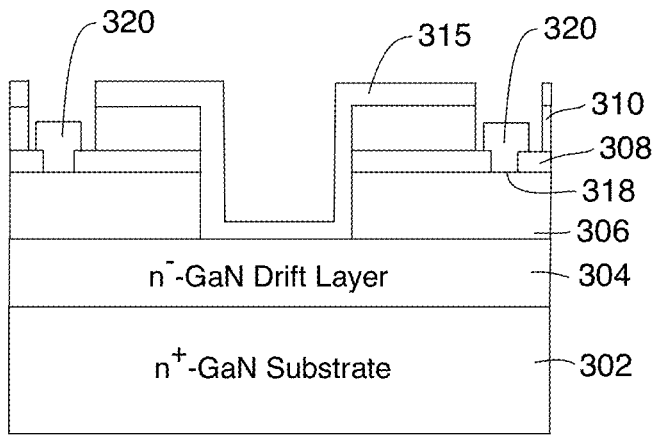

Next see FIG. 4-2. On top of the base layer 306, $SiO_2$ (not shown) is deposited and patterned to be removed by etching except in the areas identified by numerals 309. By using the remaining $SiO_2$ mask at numerals 309 as a regrowth mask, a selective area regrowth of n+ GaN (forming a n+ GaN source layer 308) is performed (preferably by MOCVD) on top of the base layer 306. After removing the remaining $SiO_2$ at numerals 309, openings occur at numerals 309 in layer 308 as FIG. 4-2 shows. The $SiO_2$ used as the regrowth mask can be removed using a Buffered Oxide Etch (BOE), which typically may be a diluted HF solution, exposing openings at numerals 309. The n+ GaN source layer 308 is preferably about 200 to 400 nm thick, with a Si concentration preferably of $\sim5\times10^{18}$ $cm^{-3}$. After that, 2-μm-wide gate trenches 312 are formed (see the single gate trench 312 in FIGS. 2 and 4-3, but since multiple transistors 300 may be formed at the same time, multiple trenches 312 may also be formed at the same time, preferably one gate trench 312 for each transistor 300). The gate trench 312 preferably has a hexagonal shape when viewed from a top or plan view as depicted by FIG. 5-1. A plurality of devices 300 are preferably formed at the same time and may preferably connected in parallel with each other. Gate trenches 312 are preferably formed by a Cl-based Inductively Coupled Plasma (ICP) etch, preferably using another layer of patterned SiO$_2$ (not shown) as an etch mask.

The wafer is then preferably subjected to a Tetra-Methyl Ammonium Hydroxide (TMAH) wet etching treatment to clean the etched surfaces and to smooth the sidewall surfaces gate trenches 312. After that, the AlN/SiN dielectric stack 315 (see FIG. 2), with the AlN layer 313 doped by Mg, as described above, is formed (and preferably grown by MOCVD) as is depicted by FIGS. 2 and 4-4. Preferably, ammonia is used as the nitrogen source for the AlN and SiN. The dielectric growth conditions may be adjusted as needed or desired to improve coverage over the gate trench 312. The transistor 300 is then preferably annealed as is described in greater detail below. The anneal may be performed after each individual layer 313 and 314 in stack 315 is formed.

After the gate dielectric stack 315 deposition, source contact vias 316 are opened (see FIG. 4-5) by dry etching through the gate dielectric 315, then by BOE wet etching through the underlying SiO$_2$ layer 310. Openings 309 in the underlying n+ GaN layer 308 have preferably been formed earlier during the selective regrowth of layer 308 (see FIG. 3-2) and filled with SiO$_2$ 310 as shown in FIG. 4-3. The BOE wet etching of vias 316 and 309 preferably avoids the exposure of the p-GaN surface 306 to plasma dry etching, which is often detrimental to the formation of a p-GaN ohmic contact. Body contact metalization at numeral 318 (see FIG. 4-6) to the exposed p-GaN base layer 306 through opening 309 is formed by alloying Ni/Au contacts 320.

After the formation of Ni/Au contacts 320, a Ti/Al metal stack is deposited and patterned (i) to form both a top portion 322 of the source electrodes 321 and (ii) to form the gate electrode 324, with the top portion of the source electrodes 322 overlaying and contacting the body contacts 320 as is depicted by FIG. 4-7 to define the source electrodes 321 of transistor 300 as is depicted by FIG. 2.

Figures 4, 5, 6, 7:
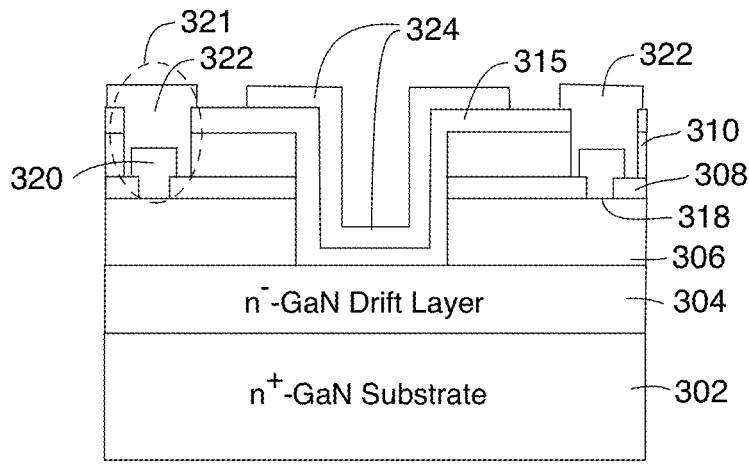
Figures 4, 5, 6, 7, 8:
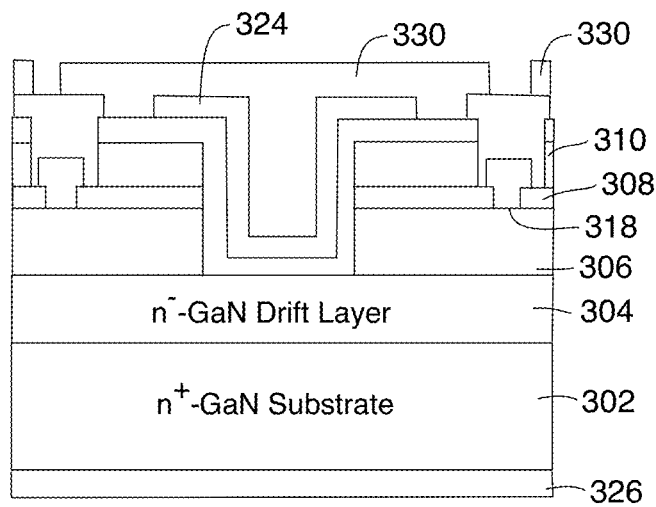
Figures 4, 5, 6, 7, 8, 9:
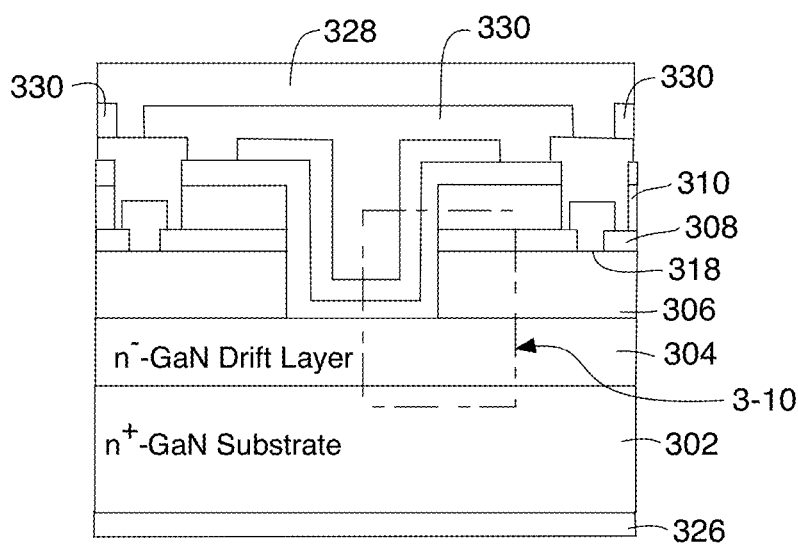
Figures 4, 5, 6, 7, 8, 9, 10:
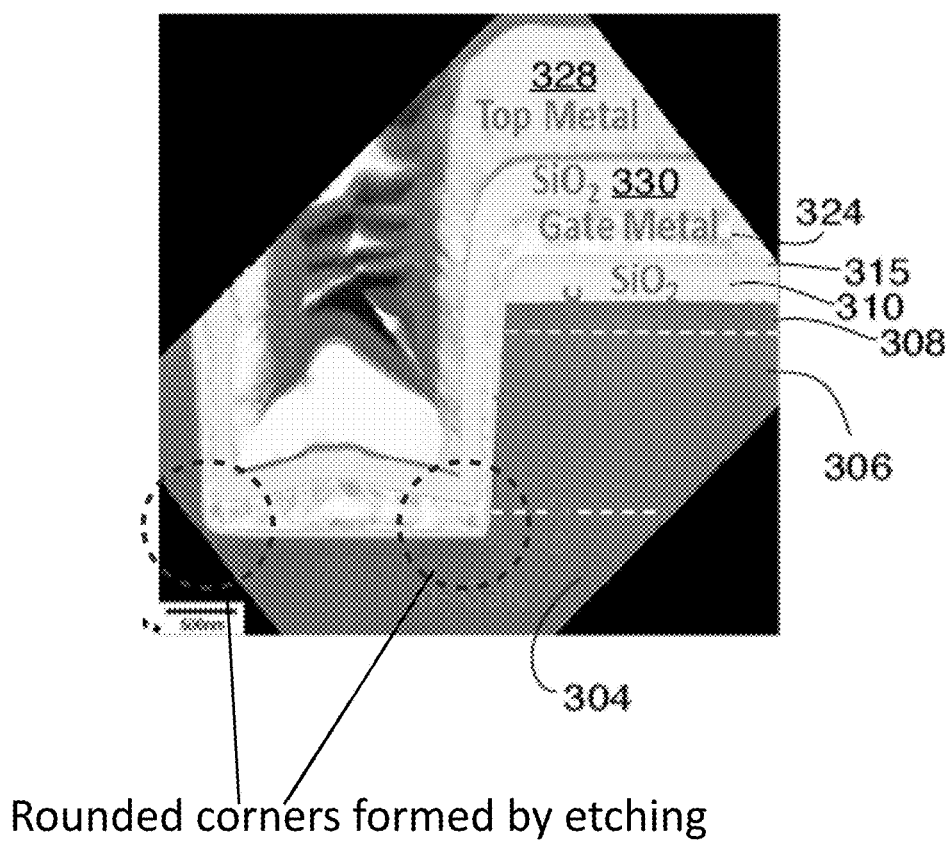

After the source/gate metallization depicted by FIG. 4-7, a Ti/Ni/Au stack 326 is preferably deposited (see FIG. 4-8) on the backside of the depicted wafer to define the drain electrode 326 of transistor 300. Ti/Au source metal interconnect 328 is preferably formed on the front side, preferably using a SiO$_2$ layer 330 as an inter-metal dielectric/passivation layer as is depicted by FIG. 4-9 and FIG. 7. As is shown in FIG. 7, a Ti/Au gate metal interconnect 336 is depicted. In a top view, it would be spaced from the Ti/Au source metal interconnect 328 (see also FIG. 5-1) so that the gate electrodes 324 and source electrodes 321 are isolated from each other when plurality of the vertical FETs 300 are made at the same time.

A cross-sectional TEM of a portion of the gate structure is shown in FIG. 4-10. The two dashed lines denote a source/base junction between layers 306 and 308 and a base/drain junction between layers 304 and 306, which are not clearly visible in this TEM. Otherwise this TEM is labeled consistent with the other figures.

The thickness of the AlN layer 313 (see FIG. 2) is preferably between 1 nm and 50 μm and more preferably between 15 nm and 30 nm. There is apparently no hard limit for the thickness of the AlN layer 313. It behaves as a spacer to separate the GaN channel and the SiN layer 314 to avoid an undesirable hysteresis effect. We found that 20 nm thick AlN dielectrics used in lateral HEMTs is good enough to eliminate the hysteresis effect. See U.S. Pat. No. 8,883,709, "III-nitride metal insulator semiconductor field effect transistor" R. Chu et al. inventors, granted Oct. 7, 2014.

The Mg dopant concentration in the AlN layer 313 is preferably between $2\times10^{18}$ to $5\times10^{18}$ cm$^{-3}$. The higher the Mg concentration is, the more positive the gate threshold voltage is.

For aforementioned anneal of the AlN layer 313 and the SiN layer 314, the anneal temperature should not be lower than 800° C. for this post dielectric stack 315 deposition anneal. Currently the anneal is performed at 850° C. for 15 min. Normally more than 10 min is required to fully activate the Mg atoms. This thermal annealing of stack 312 should be performed in an ambient not containing H$_2$ and preferably is done in a N$_2$ atmosphere. This anneal may be performed twice, once after the AlN layer 313 is formed and again after the SiN layer 314 is formed.

During the dielectric AlN growth by MOCVD, hydrogen atoms from cracked ammonia molecules can passivate the p-type dopant Mg, degrading its p-type properties. Therefore re-activating the Mg by the above-mentioned thermal anneal is important. Without the anneal, much of the Mg occurs as a neutral impurity in the AlN as opposed to an acceptor atom.

FIG. 4-1 is a top view schematic of an embodiment of the present invention which has a hexagonal layout design. FIG. 4-1 shows one device (which may correspond to the vertical transistor 300 of FIGS. 3-1 through 3-9) at its center and portions of six other such devices 300 surrounding the centrally disposed device, all of which devices 300 are preferably formed at the same time. As is depicted by FIG. 4-1, a hexagonal cell structure is preferably used to maximize the packing density as a plurality of transistors are preferably connected in parallel with each other. The cell pitch size is 28 μm in this embodiment, but other cell pitch=sizes am be employed if desired. The transistor 300 in this embodiment preferably has an active area of 0.5 mm$^2$, which includes the source/gate electrode area but excludes the bond pad areas shown in FIG. 4-2. The total gate width of the 0.5 mm$^2$ device is about 71 mm. A top view schematic of the layout design is shown by FIG. 4-1, while a microscopic photograph of a fabricated device is shown by FIG. 4-2. FIG. 4-2 shows the top view of a whole device connecting many single transistor 300 in parallel by adding metal layers to connect to their sources the gates. The drains of the 326 are commonly accessible on the back sides of the plurality of transistors 300.

Figures 1, 5:
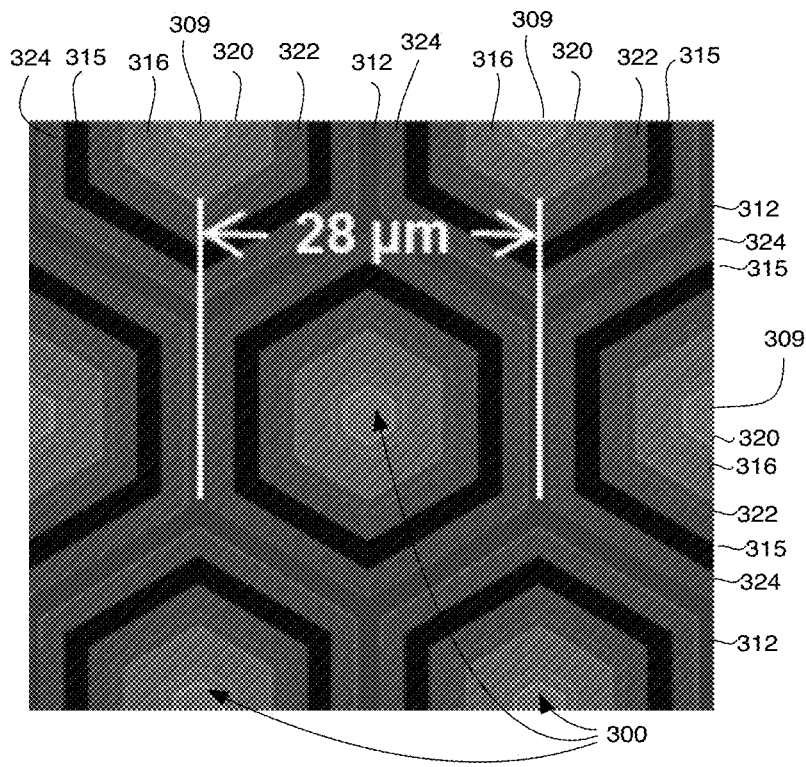
Figures 2, 5:
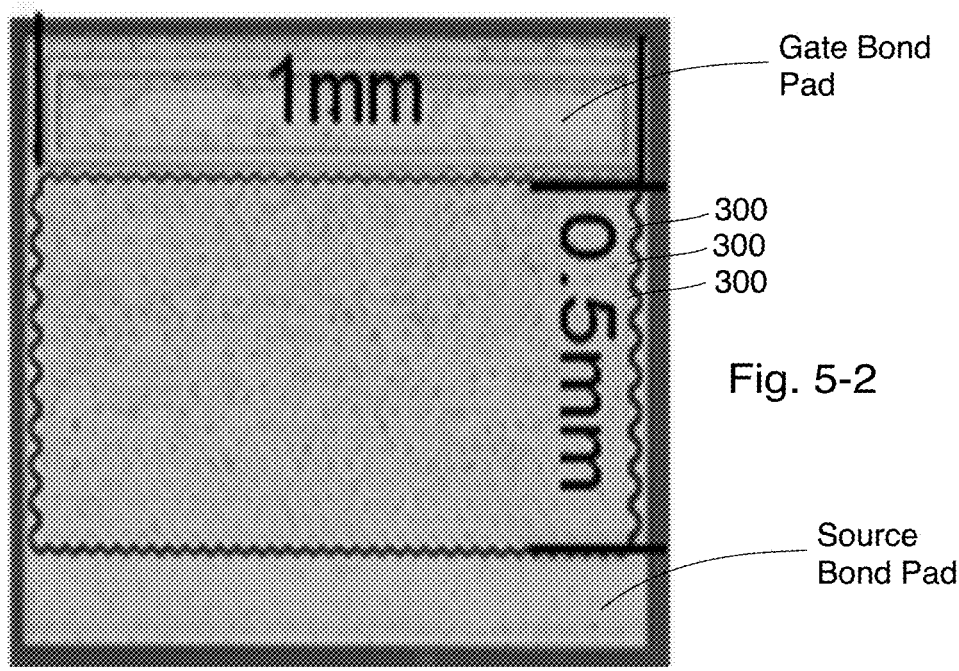
Figure 5A:
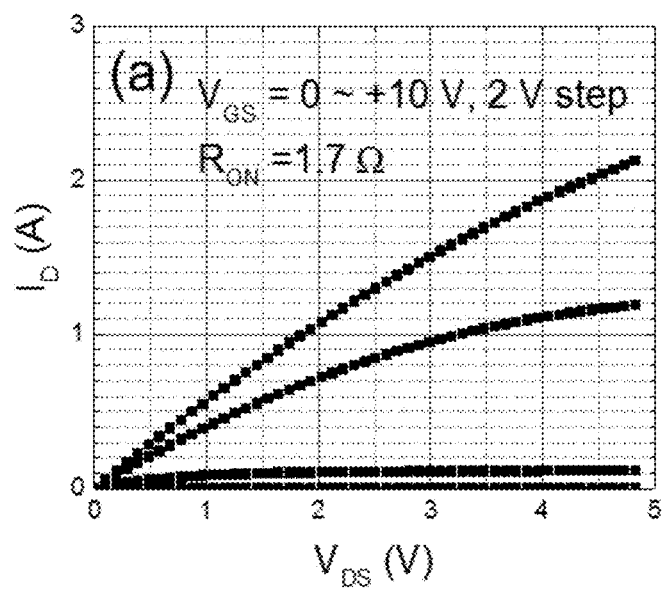
Figure 5B:
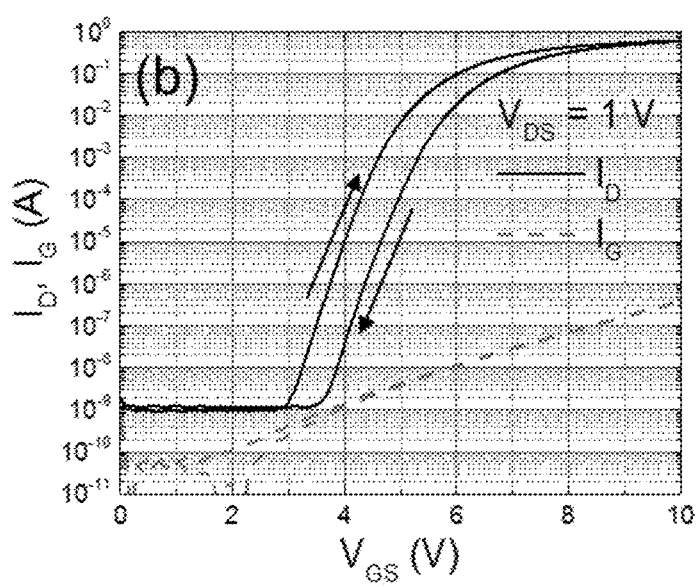
FIG. 5(b) is a graph of the transfer IV characteristics of the fabricated GaN vertical trench MOSFET of FIG. 5-1.

FIG. 5(a) is a graph of the output IV characteristics of the fabricated GaN vertical trench MOSFET 300. The cell pitch size is 28 μm and the active area is 0.5 mm$^2$. FIG. 5(b) is a graph of the transfer IV characteristics of the fabricated GaN vertical trench MOSFET 300.

On-wafer direct-current (DC) current-voltage (IV) characterization was performed using an Agilent® B1505A power device analyzer. The output and transfer current-voltage (IV) characteristics are plotted in FIGS. 5(a) and 5(b). From the output IV curves, one can extract an R$_{ON}$ of 1.7Ω at a gate bias of 10 V, for the 0.5 mm$^2$ area device. This translates to a specific on-resistance (R$_{ON}$×A) of 8.5 mΩ-cm$^2$. A Schottky diode made with the same drift layer has a specific R$_{ON}$ of 2~3 mΩ-cm$^2$, suggesting that the large cell pitch size and/or the channel resistance are limiting factors of the total on-resistance. Improvement of total on-resistance can be achieved by: (1) reducing the cell pitch size; (2) improving the dielectric/semiconductor interface quality; (3) optimizing the drift layer growth condition for better electron mobility.

Figure 6A:
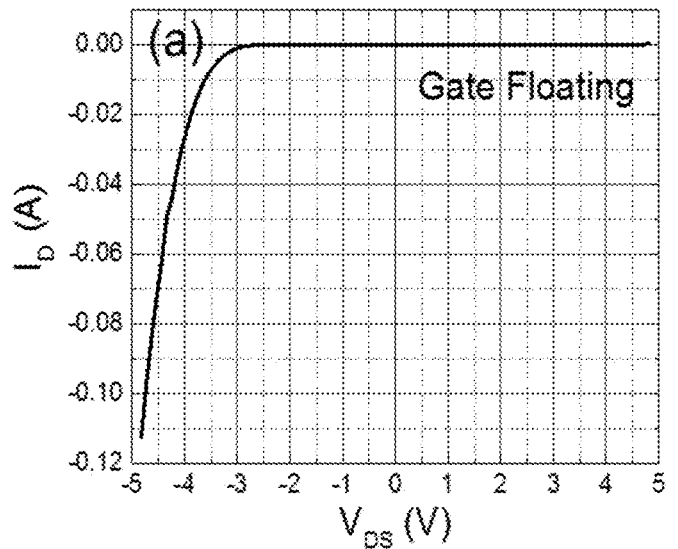
FIG. 6(a) is a graph of body diode IV characteristics and FIG. 6(b) is a graph of off-state leakage characteristics of the fabricated GaN vertical trench MOSFET of FIG. 4-1.
Figure 6B:
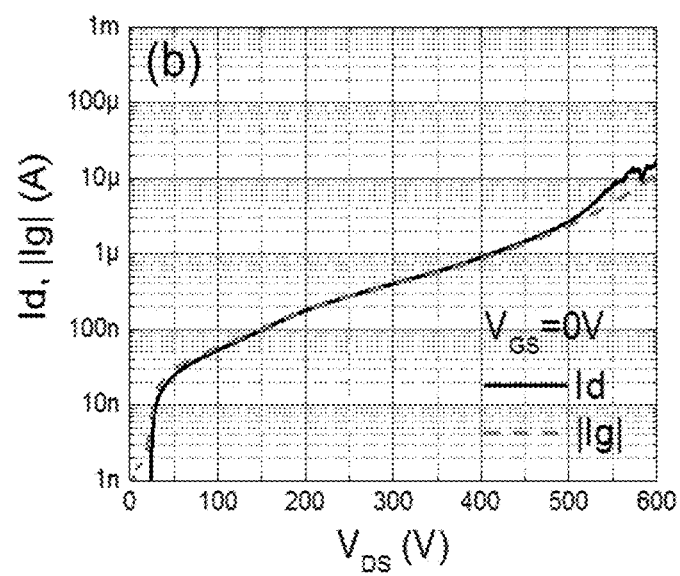
Figure 7:
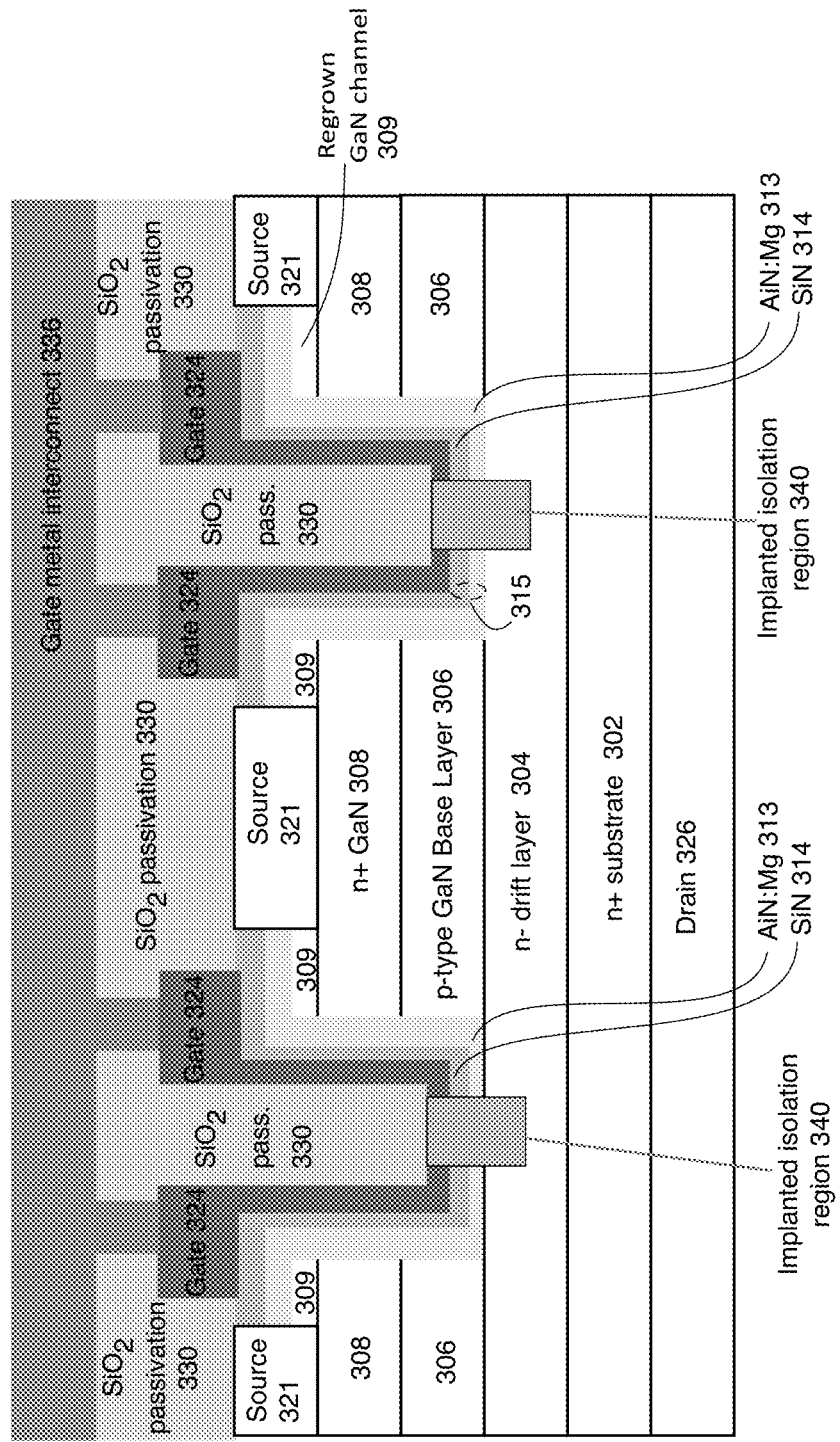

FIG. 6(a) is a graph of body diode IV characteristics and FIG. 6(b) is a graph of off-state leakage characteristics of the fabricated GaN vertical trench MOSFET of FIG. 5-1. The cell size is 28 μm and the active area is 0.5 mm². Note that the pitch or center-to-center distance is also 28 μm.

FIG. 6(a) shows the drain-to-source body diode IV characteristics, with the gate electrode floating. There was no current conduction under positive drain-to-source bias, because the base/drain pn junction was reverse biased. Under a negative drain-to-source bias, current conduction starts at around −3 V, which is the turn-on voltage of the base/drain pn junction. The well-behaved pn junction IV characteristics suggest success in forming a body contact 318 to the p-GaN base layer 306. Proper body contact at 318 is desirable for maintaining the p-GaN base layer 306 at zero potential (ground potential) during transistor 300 operation as the sources of each of the transistors 300 in the array of transistors 300 is preferably grounded during operation. Without a proper body contact 318, a positive drain-to-source bias can result in a positive body bias (and the potential on the based layer 308 the tends to float). A positive body bias of layer 308 shifts the threshold voltage toward the negative, causing increased off-state leakage current and false turn-on. So being able to form a good metal to semiconductor contact at 318, without dry etching layer 308, is one desirable feature of these embodiments.

For example, layer 308 is preferably formed by selective regrowth. If layer 308 were instead formed by depositing a layer of 308 material and then patterning it afterwards, that would likely lead to the formation of openings 309 by dry etching, and that dry etching is undesirable for the reasons already given. So layer 308 should be formed using a process such as selective regrowth which allows openings 309 to be created by using a wet etch, for example, as opposed to a dry etch.

FIG. 6(b) shows off-state drain and gate leakage characteristics. At $V_{GS}$ of 0 V, 600 V blocking was achieved with the drain/gate leakage at around 10 μA. The off-state leakage is dominated by the gate-to-drain leakage. Suppression of the gate-to-drain leakage requires: 1. optimization gate trench etch process to achieve the rounded corners depicted by FIG. 3-10 (for comparison see the sharp corners in the TEM of FIG. 3-11 for a different device); 2. further improvement of gate dielectric 315 conformity which can be obtained by carefully monitoring and optimizing the MOCVD growth conditions like pressure, ammonia flow, etc, to improve the uniformity of the dielectric layer 315 thickness on the sidewalls 312; 3. improvement of edge termination structure. We used ion implantation to make the edge of the devices insulating. The devices here refer to that shown in FIGS. 5-1, 5-2.

The disclosed GaN vertical trench MOSFET 300 has three important process innovations: (1) an AlN:Mg/SiN dielectric stack 215 in the gate trench; (2) the anneal, which, especially combined with the aforementioned stack 215, increases the gate threshold voltage; and (3) selective area regrowth of n+-GaN source layer 308 (see numeral 309 in FIG. 7) allowing body contact 320 formation. The fabricated 0.5-mm²-active-area transistor 300 showed a threshold voltage of 4.8 V, a blocking voltage of 600 V at gate bias of 0 V, and on-resistance of 1.7Ω at gate bias of 10V.

The threshold (turn on or turn off) voltage of the transistor 300 can be tuned by using different concentrations of Mg in the dielectric layer 313. Mg will be activated, by performing a thermal anneal, preferably under a $N_2$ atmosphere after the dielectric regrowth, with the annealing temperature above 750° C. Adjusting the annealing temperature can also affect the threshold voltage of the transistor 300, but it is not believed to be as precise as Mg concentration control.

FIG. 7 shows two vertical FETs, each similar to the vertical FET embodiment of FIG. 2, but with a passivation layer 330, a gate interconnect layer 336 and a implanted isolation region 340 also shown. Nitrogen and Aluminum could be used for this implantation region 340. The depth is up to about 1 μm.

Attached as Appendix A is a paper regarding this technology, which published after the filing date of U.S. Provisional Patent Application No. 62/402,986 to which priority is claimed. Appendix A is hereby incorporated herein by this reference.

Materials other than the specific material identified herein may well be able to be substituted for the materials identified herein without departing from the essence of this invention. For just one example, other type-III semiconductor materials than Ga may be used in the formation of layers 304, 306 & 308. These other type-III semiconductor materials would include, for example, at least other Ga based alloys such as InGaN, AlGaN, and InAlGaN. In principle, the method of this disclosure applies to most nitride HEMTs with a channel of GaN or InGaN or AlGaN, and the barrier of AlN or AlGaN or InAlN or InAlGaN. Adding Mg to the gate dielectric and using the anneal discussed herein should yield HEMTs with a higher gate turn on voltage. This is true whether or not the gate structure has a vertical orientation or a horizontal (or lateral) orientation. Adding Mg to the gate dielectric will pull up the conduction band of the channel and increase the threshold voltage for both vertical and lateral gate devices.

The foregoing description of the disclosed embodiments and the methods of making same has been presented for the purposes of illustration and description. It is not intended to be exhaustive or to limit the invention to the precise form or methods disclosed. Many modifications and variations are possible in light of the above teachings. It is intended that the scope of the invention be limited not by this detailed description or the concepts set forth above, but rather by the claims appended hereto.

What is claimed is:

1. A field effect transistor having at least gate, source, and drain electrodes and a semiconductor channel for controlling transport of charge carriers between the source and drain electrodes, the gate electrode being insulated from the semiconductor channel by a Group III-nitride gate dielectric layer, at least a portion of the Group III-nitride gate dielectric layer layer disposed between the gate electrode and the semiconductor channel being formed from the Group III-nitride gate dielectric layer that is doped with a p-type dopant and wherein an additional semiconductor layer is disposed on the semiconductor channel and wherein the Group III-nitride gate dielectric layer and the gate electrode are disposed in a trench at least partially penetrating the additional semiconductor layer.

2. A field effect transistor having at least a gate electrode, a source electrode, and a drain electrode and a semiconductor channel for controlling transport of charge carriers between the source and drain electrodes, the gate electrode being insulated from the semiconductor channel by a Group III-nitride dielectric layer, at least a portion of the Group III-nitride dielectric layer disposed between the gate electrode and the semiconductor channel being doped with a p-type dopant wherein the p-type dopant is Magnesium having concentration of Magnesium in the dielectric which is on the order of $2 \times 10^{18}$ cm$^{-3}$.

3. A field effect transistor having at least a n-type Group III-nitride material drift layer, a p-type Group III-nitride material base layer disposed over the n-type Group III-nitride material drift layer, and a Group III-nitride gate dielectric layer disposed in contact or adjacent (i) the n-type Group III-nitride material drift layer or (ii) with a channel layer in contact with the n-type Group III-nitride material drift layer, at least a portion of the Group III-nitride gate dielectric layer being formed from gas phase dielectric material components which were mixed with a p-type impurity prior to being disposed as the Group III-nitride gate dielectric layer in said field effect transistor.

4. The field effect transistor of claim 3 wherein said p-type impurity is Magnesium.

5. The field effect transistor is claim 4 wherein the Magnesium in the Group III-nitride gate dielectric layer is activated by annealing.

6. The field effect transistor is claim 4 wherein the element Magnesium in the Magnesium in the Group III-nitride gate dielectric layer is activated by annealing to a temperature of at least 500° C. to thereby alter a threshold voltage of the field effect transistor.

7. The field effect transistor is claim 4 wherein the Magnesium in the Group III-nitride gate dielectric layer is activated by annealing to a temperature of at least 750° C. to thereby alter a threshold voltage of the field effect transistor.

8. The field effect transistor is claim 4 wherein the at least a portion of the Group III-nitride gate dielectric layer doped with Magnesium is AlN.

9. The field effect transistor is claim 8 wherein a second gate dielectric layer of SiN is on the Group III-nitride gate dielectric layer.

10. The field effect transistor is claim 9 wherein the AlN and SiN form a two layer dielectric stack with the AlN being in contact with n-type Group III-nitride material drift layer and the SiN being in contact with a gate electrode of the field effect transistor.

11. The field effect transistor of claim 10 wherein a n-type Group III-nitride material source layer is disposed on the p-type Group III-nitride material base layer and wherein at least one source electrode is disposed on the n-type Group III-nitride material source layer.

12. The field effect transistor of claim 11 wherein the Group III-nitride material of the source, base and drift layers is GaN.

13. The field effect transistor of claim 5 wherein the Group III-nitride gate dielectric layer is spaced from the n-type Group III-nitride material drift layer by the channel layer.

14. The field effect transistor of claim 13 wherein the at least a portion of the Group III-nitride gate dielectric layer doped or imbued with Magnesium is Al and wherein a SiN gate dielectric layer is on the Group III-nitride gate dielectric layer.

15. The field effect transistor of claim 14 wherein the Group III-nitride material of the base and drift layers is GaN.

16. The field effect transistor of claim 1 wherein the Group III-nitride gate dielectric layer is in direct contact with the semiconductor channel.

17. A field effect transistor having at least gate, source, and drain electrodes and a semiconductor channel for controlling transport of charge carriers between the source and drain electrodes, the gate electrode being insulated from the semiconductor channel by a Group III-nitride gate dielectric layer, at least a portion of the Group III-nitride gate dielectric layer disposed between the gate electrode and the semiconductor channel being formed from the Group III-nitride gate dielectric layer that is doped with a p-type dopant and wherein the semiconductor channel occurs in a p-type base layer.

18. The field effect transistor of claim 1 wherein the p-type dopant is Magnesium.

19. The field effect transistor of claim 18 wherein a SiN gate dielectric layer doped with the p-type dopant on the Group III-nitride gate dielectric layer, with one of said gate dielectric layers being doped throughout at least a portion of a thickness of same with said p-type dopant.

20. The field effect transistor of claim 18 wherein a SiN gate dielectric layer doped with the p-type dopant is on the Group III-nitride gate dielectric layer, the semiconductor channel is disposed between an n-type drift layer and one of said gate dielectric layers doped throughout at least a portion of thickness of same with said p-type dopant.

21. The field effect transistor of claim 18 wherein the Group III-nitride gate dielectric layer has an upper surface and a lower surface with the upper surface being closer to the gate electrode than the lower surface, said p-type dopant occurring throughout at least a portion of a thickness of the Group III-nitride gate dielectric layer between the upper and lower surfaces thereof.

22. The field effect transistor of claim 21 wherein the p-type dopant is Magnesium.

23. The field effect transistor of claim 1 wherein the Group III-nitride gate dielectric layer is in direct contact with the semiconductor channel.

24. The field effect transistor of claim 1 wherein the Group III-nitride gate dielectric layer has an upper surface and a lower surface with the upper surface being closer to the gate electrode than the lower surface, the magnesium dopant occurring throughout at least a portion of a thickness of the Group III-nitride gate dielectric layer between the upper and lower surfaces thereof.

25. The field effect transistor of claim 18 wherein a predetermined concentration of the p-type dopant is selected to control a turn-on voltage of said field effect transistor.

26. The field effect transistor of claim 18 wherein a predetermined concentration of the p-type dopant is selected to control a turn-off voltage of said field effect transistor.

27. The field effect transistor of claim 4 wherein the Group III-nitride gate dielectric layer layer has a predetermined concentration of Magnesium of about of $2 \times 10^{18}$ cm$^{-3}$.

28. The field effect transistor of claim 3 wherein the Group III-nitride gate dielectric layer layer is disposed in contact with the n-type Group III-nitride material drift layer.

29. A field effect transistor having at least gate, source, and drain electrodes and a semiconductor channel for controlling transport of charge carriers between the source and drain electrodes, the gate electrode being insulated from the semiconductor channel by a dielectric layer, at least a portion of the dielectric layer disposed between the gate electrode and the semiconductor channel being AlN doped with Magnesium and wherein the concentration of Magnesium in the AlN is on the order of $2 \times 10^{18}$ cm$^{-3}$.

30. A field effect transistor having at least gate, source, and drain electrodes and a semiconductor channel for controlling transport of charge carriers between the source and drain electrodes, the gate electrode being insulated from the semiconductor channel by a Group III-nitride gate dielectric layer, at least a portion of the Group III-nitride gate dielectric layer disposed between the gate electrode and the semiconductor channel being doped with a p-type dopant, the field effect transistor further including a barrier layer disposed between the Group III-nitride gate dielectric layer and the semiconductor channel.

31. The field effect transistor of claim 30 wherein a SiN gate dielectric layer is on the Group III-nitride gate dielectric layer, with one of said gate dielectric layers being doped throughout at least a portion of a thickness of same with said p-type dopant.

32. The field effect transistor of claim 30 wherein the Group III-nitride gate dielectric layer is AlN, the p-type dopant is Mg and the barrier layer comprises a layer of AlGaN.

33. The field effect transistor of claim 1 wherein a concentration of Magnesium in the Group III-nitride gate dielectric layer selectively tunes a turn on voltage of the field effect transistor.

34. The field effect transistor of claim 33 wherein the concentration of Magnesium in the Group III-nitride gate dielectric layer is essentially uniform throughout a thickness of a portion of the Group III-nitride gate dielectric layer.

35. A vertical field effect transistor having at least gate, source, and drain electrodes and a semiconductor channel for controlling transport of charge carriers between the source and drain electrodes, the gate electrode being insulated from the semiconductor channel by a Group III-nitride dielectric layer, at least a portion of the dielectric layer disposed between the gate electrode and the semiconductor channel being doped with a p-type dopant, the source and gate electrodes being disposed at or near a top of the transistor and the drain electrode being disposed at or near a bottom of the transistor, the semiconductor channel being located between the gate and drain electrodes and insulated from said gate electrode by said Group III-nitride dielectric layer at least a portion of which is doped by said p-type dopant.

* * * * *